(12) United States Patent
Zhao et al.

(10) Patent No.: US 11,579,027 B2
(45) Date of Patent: Feb. 14, 2023

(54) DISPLAY PANEL, PREPARING METHOD THEREOF, AND DISPLAY DEVICE

(71) Applicant: BOE Technology Group Co., Ltd., Beijing (CN)

(72) Inventors: Meng Zhao, Beijing (CN); Xiaolong Li, Beijing (CN); Zheng Liu, Beijing (CN); Chunyang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 204 days.

(21) Appl. No.: 16/832,567

(22) Filed: Mar. 27, 2020

(65) Prior Publication Data

US 2021/0025768 A1 Jan. 28, 2021

(30) Foreign Application Priority Data

Jul. 25, 2019 (CN) .......................... 201910678617.1

(51) Int. Cl.
*G01L 1/22* (2006.01)
*G01L 1/20* (2006.01)
(Continued)

(52) U.S. Cl.
CPC ............ *G01L 1/2206* (2013.01); *G01L 1/205* (2013.01); *H01L 27/00* (2013.01); *H01L 27/3225* (2013.01); *H05K 5/0017* (2013.01)

(58) Field of Classification Search
CPC ....... G01L 1/2206; G01L 1/205; H01L 27/00; H01L 27/3225; H05K 5/0017;
(Continued)

(56) References Cited

U.S. PATENT DOCUMENTS

2016/0190216 A1  6/2016 Yang et al.
2016/0240605 A1  8/2016 Lee et al.
(Continued)

FOREIGN PATENT DOCUMENTS

CN  105741687 A  7/2016
CN  106371672 A  2/2017
(Continued)

OTHER PUBLICATIONS

Office Action for corresponding Chinese Application 201910678617.1 dated Sep. 27, 2021.
(Continued)

*Primary Examiner* — Ermias T Woldegeorgis
(74) *Attorney, Agent, or Firm* — ArentFox Schiff LLP; Michael Fainberg

(57) ABSTRACT

The present disclosure relates to the field of display technologies, and discloses a display panel, a preparing method thereof, and a display device. The display panel has a bending area, and the display panel includes a sensing component; the sensing component includes a differential bridge connection circuit composed of a first strain sensor, a second strain sensor, a third strain sensor, and a fourth strain sensor; the first strain sensor, the second strain sensor, the third strain sensor, and the fourth strain sensor are resistance transducers, and are located in the bending area; the first strain sensor and the fourth strain sensor constitute first opposite bridge arms; the second strain sensor and the third strain sensor constitute second opposite bridge arms, and the first opposite bridge arms and the second opposite bridge arms are separately located on two sides of a neutral layer of the display panel.

13 Claims, 3 Drawing Sheets

(51) Int. Cl.
  *H05K 5/00*      (2006.01)
  *H01L 27/32*     (2006.01)
  *H01L 27/00*     (2006.01)

(58) Field of Classification Search
  CPC ...... G06F 1/1677; G06F 1/1652; G09F 9/301; G01B 7/18
  See application file for complete search history.

(56) References Cited

U.S. PATENT DOCUMENTS

2017/0194384 A1    7/2017   Zhou et al.
2018/0040678 A1    2/2018   Zhai
2019/0368952 A1*  12/2019   Li ........................ G06F 3/0445

FOREIGN PATENT DOCUMENTS

| | | | | |
|---|---|---|---|---|
| CN | 107092118 A * | 8/2017 | ......... | G02F 1/13338 |
| CN | 107195667 A | 9/2017 | | |
| CN | 107390930 A | 11/2017 | | |
| CN | 108831311 A | 11/2018 | | |
| CN | 109285864 A | 1/2019 | | |
| WO | WO-2018133054 A1 * | 7/2018 | ........... | G01L 1/2287 |

OTHER PUBLICATIONS

Office Action for corresponding Chinese Application 201910678617.1 dated Jan. 19, 2019.

\* cited by examiner

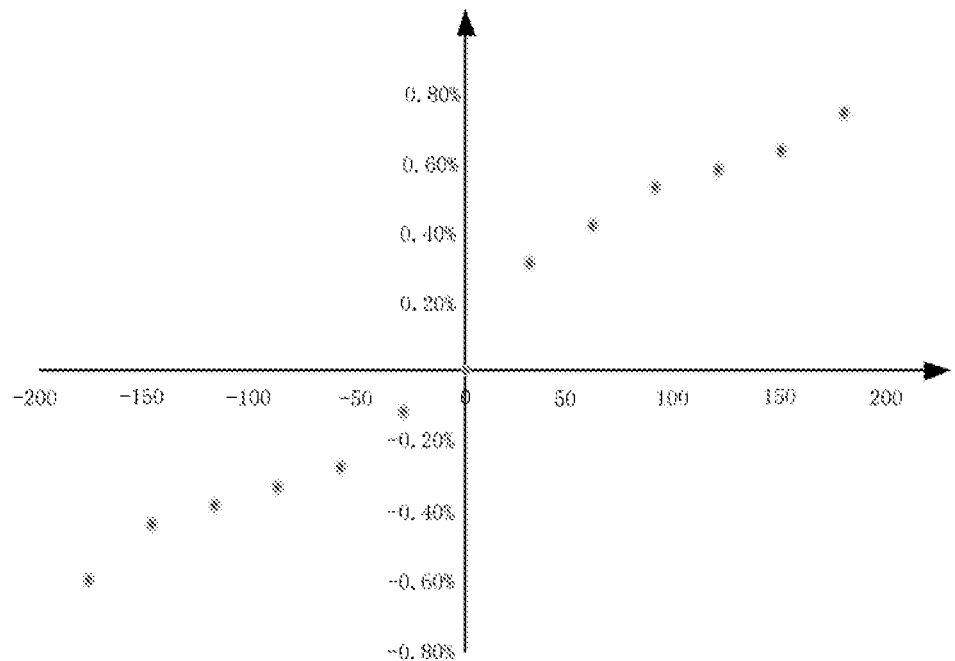

FIG. 5

```
preparing a source-drain electrode material layer on the substrate, and forming     — 101
patterns of the first source-drain electrode layer, the first strain sensor, and the
        fourth strain sensor by using a patterning process
                              ↓
    manufacturing a cathode layer on the first source-drain electrode layer         — 102
                              ↓
  preparing a source-drain electrode material layer on the cathode layer, and       — 103
 forming patterns of the second source-drain electrode layer, the second strain
      sensor, and the third strain sensor by using a patterning process
```

FIG. 6

DISPLAY PANEL, PREPARING METHOD THEREOF, AND DISPLAY DEVICE

The present application claims priority to Chinese Patent Application No. 201910678617.1 filed with the Chinese Patent Office on Jul. 25, 2019, which is hereby incorporated by reference in its entirety.

FIELD

The present disclosure relates to the field of display technologies, and in particular, to a display panel, a preparing method thereof, and a display device.

BACKGROUND

Currently, integrated bending sensors are mainly in a resistive type and in a capacitive type. The working principle of a resistive bending sensor is to use the characteristic that the resistance changes under stretching of a metal wire in a bending state to transmit a signal of the bending state.

SUMMARY

The present disclosure discloses a display panel, a preparing method thereof, and a display device, which includes that:

A display panel, wherein the display panel has a bending area, and includes a sensing component configured to sense a bending state of the bending area; and
  wherein the sensing component includes
  a differential bridge connection circuit composed of a first strain sensor, a second strain sensor, a third strain sensor, and a fourth strain sensor; and
  wherein
    the first strain sensor, the second strain sensor, the third strain sensor, and the fourth strain sensor are resistance transducers, and are located in the bending area;
    the first strain sensor and the fourth strain sensor constitute first opposite bridge arms; the second strain sensor and the third strain sensor constitute second opposite bridge arms, and
    the first opposite bridge arms and the second opposite bridge arms are separately located on two sides of a neutral layer of the display panel.

Optionally, the first strain sensor and the fourth strain sensor are disposed on a same layer, the second strain sensor and the third strain sensor are disposed on a same layer, and the first strain sensor, the second strain sensor, the third strain sensor, and the fourth strain sensor are same in material, shape, and size.

Optionally, the display panel further has a display area and a non-display area disposed around the display area; wherein
  the first strain sensor and the fourth strain sensor are symmetrically disposed on the non-display area at both sides of the display area; and
  the second strain sensor and the third strain sensor are symmetrically disposed on the non-display area at both sides of the display area.

Optionally, the neutral layer is a cathode layer; and
  the display panel further includes a substrate and a cover plate separately located on two sides of the cathode layer; wherein
    the first strain sensor and the fourth strain sensor are located between the cathode layer and the substrate; and
    the second strain sensor and the third strain sensor are located between the cathode layer and the cover plate.

Optionally, the display panel further includes:
  a first source-drain electrode layer located between the substrate and the cathode layer, and
  a second source-drain electrode layer located between the cathode layer and the cover plate;
    wherein: the first strain sensor, the fourth strain sensor, and the first source-drain electrode layer are made of same material, and are prepared in same layer; and
    the second strain sensor, the third strain sensor, and the second source-drain electrode layer are made of same material, and are prepared in same layer.

Optionally, the first strain sensor, the second strain sensor, the third strain sensor, and the fourth strain sensor are made of titanium, aluminum, or a titanium composite material.

Optionally, the first source-drain electrode layer includes a first source-drain electrode located in the display area and a drive line disposed around the display area;
  the display panel further includes a crack dam disposed around the drive line; and
  the first strain sensor and the fourth strain sensor are located between the drive line and the crack dam.

Optionally, the first strain sensor and the second strain sensor constitute adjacent bridge arms, and a projection of the first strain sensor on the neutral layer overlaps with a projection of the second strain sensor on the neutral layer; and
  the third strain sensor and the fourth strain sensor constitute adjacent bridge arms, and a projection of the third strain sensor on the neutral layer overlaps with a projection of the fourth strain sensor on the neutral layer.

A display device, including the display panel according to any of the above contents.

A preparing method of the display panel according to any of the above contents, further including:
  preparing a source-drain electrode material layer on the substrate, and forming patterns of the first source-drain electrode layer, the first strain sensor, and the fourth strain sensor by using a patterning process;
  manufacturing a cathode layer on the first source-drain electrode layer; and
  preparing a source-drain electrode material layer on the cathode layer, and forming patterns of the second source-drain electrode layer, the second strain sensor, and the third strain sensor by using a patterning process.

BRIEF DESCRIPTION OF THE DRAWINGS

FIG. 5 is a schematic diagram of a test result of a bending sensing experiment of strain sensors in a display panel according to an embodiment of the present disclosure; and FIG. 6 is a flowchart of a preparing method of a display panel according to an embodiment of the present disclosure.

DETAILED DESCRIPTION OF THE EMBODIMENTS

The technical solutions in the embodiments of the present disclosure are clearly and completely described below with reference to the drawings in the embodiments of the present disclosure. Obviously, the described embodiments are only some embodiments of the present disclosure, but not all the embodiments. Based on the embodiments of the present disclosure, all other embodiments obtained by those ordinarily skilled in the art without creative efforts shall fall within the protection scope of the present disclosure.

In the related art, the resistive bending sensor has the characteristics of good output linearity and good anti-noise performance. However, a rate of change of the metal resistance affected by strain is relatively small, and resolution and sensitivity of sensing are relatively poor.

Figure 1:
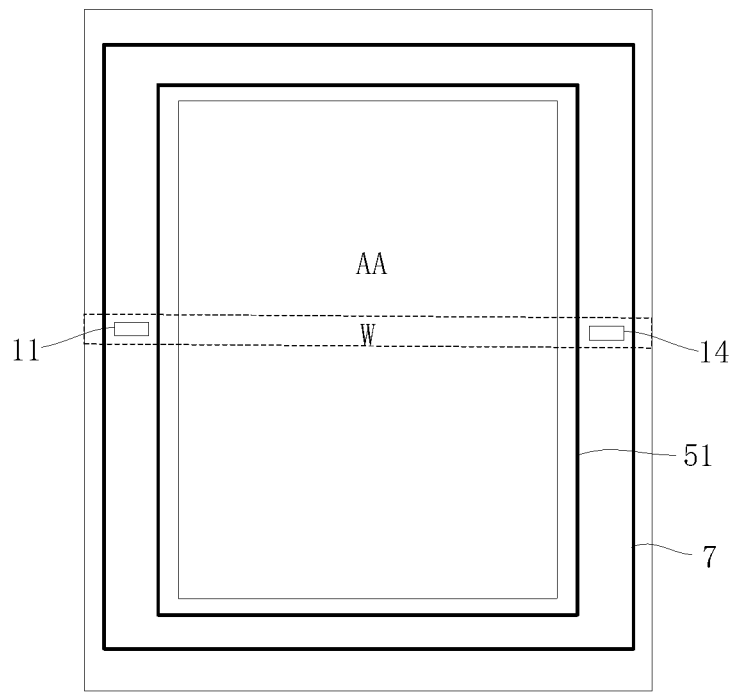
FIG. 1 is a schematic diagram of a partial structure of a display panel according to an embodiment of the present disclosure.
Figure 2:
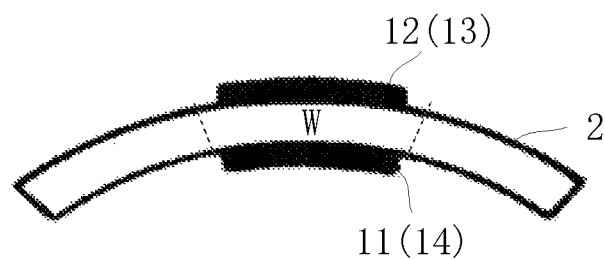
FIG. 2 is a schematic diagram of a cross-sectional view of a partial structure of a display panel according to an embodiment of the present disclosure.
Figure 3:
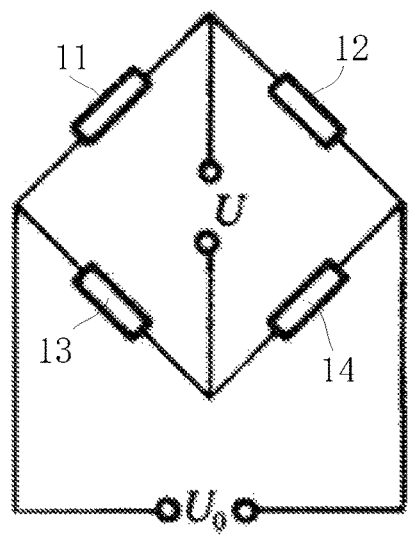
FIG. 3 is a schematic diagram of a differential bridge connection circuit of a sensing component in a display panel according to an embodiment of the present disclosure.

Therefore, as shown in FIG. 1 to FIG. 3, an embodiment of the present disclosure provides a display panel. The display panel has a bending area W, and the display panel includes a sensing component configured to sense a bending state of the bending area W.

The sensing component includes a differential bridge connection circuit composed of a first strain sensor 11, a second strain sensor 12, a fourth strain sensor 14, and a third strain sensor 13. The first strain sensor 11, the second strain sensor 12, the third strain sensor 13, and the fourth strain sensor 14 are resistance transducers and are located in the bending area W. The first strain sensor 11 and the fourth strain sensor 14 constitute first opposite bridge arms. The second strain sensor 12 and the third strain sensor 13 constitute second opposing bridge arms, and the first opposite bridge arms and the second opposite bridge arms are separately located on two sides of a neutral layer 2 of the display panel. When the bending area W of the display panel is bent, an outer layer is stretched and an inner layer is compressed, there is necessarily a transition layer with no stretch or compression on a cross section of the bending area, and the strain is almost equal to zero. That is, the transition layer is the neutral layer of the display panel.

The display panel is provided with a sensing component configured to sense a bending state. The sensing component includes a differential bridge connection circuit composed of four sensors (a first strain sensor 11, a second strain sensor 12, a third strain sensor 13, and a fourth strain sensor 14). Two sensors on the same opposite bridge arms (the first strain sensor 11 and the fourth strain sensor 14, or the second strain sensor 12 and the third strain sensor 13) are on the same side of the neutral layer 2, and have the same strain (both have a stretching strain or a compressive strain), so that resistance changes are the same. Two sensors on the same adjacent bridge arms (the first strain sensor 11 and the second strain sensor 12, or the third strain sensor 13 and the fourth strain sensor 14) are on different sides of the neutral layer 2, and have opposite strains (one has a stretching strain and the other has a compressive strain), so that resistance changes are opposite. According to a calculation formula of the bridge, when the display panel is bent, resistance changes of the four sensors can greatly improve an output voltage of the differential bridge connection circuit, and can improve resolution and sensitivity of bending sensing of the sensing component, so that sensitivity of bending sensing of the display panel is improved.

Figure 4:
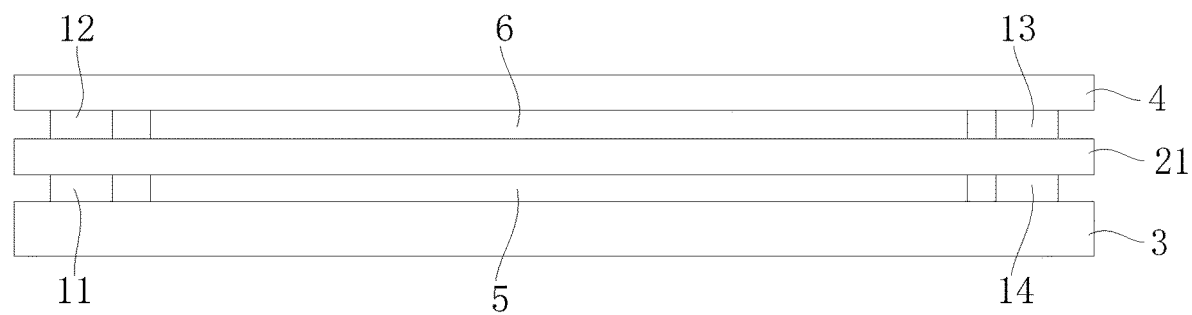
FIG. 4 is a schematic diagram of a cross-sectional view of a partial structure of a display panel according to another embodiment of the present disclosure.

As shown in FIG. 1, FIG. 2, and FIG. 4, in some embodiments, the first strain sensor 11 and the fourth strain sensor 14 are disposed on a same layer, the second strain sensor 12 and the third strain sensor 13 are disposed on a same layer, and the first strain sensor 11, the second strain sensor 12, the third strain sensor 13, and the fourth strain sensor 14 are same in material, shape, and size.

Optionally, the four sensors are exactly the same, and the two sensors of the same opposite bridge arms are on the same layer (that is, the first strain sensor 11 and the fourth strain sensor 14 are on the same layer, and the second strain sensor 12 and the third strain sensor 13 are on the same layer). According to the calculation formula of the differential bridge, impact of the temperature on a resistance value can be shielded. In addition, the two sensors of the same adjacent bridge arms are located on different layers, and the resistance changes are opposite, so that a value of the output voltage can be nearly doubled. The two sensors of the same opposite bridge arms are on the same layer, and resistance change values and changes are the same, so that the output voltage can be further increased fourfold. In conclusion, the resistance changes of the four sensors can greatly increase the output voltage of the differential bridge connection circuit, and can compensate for the impact of the temperature on the resistance value of the sensor. Therefore, there are characteristics of good linearity and good anti-noise performance of the output voltage, so that sensitivity and resolution of bending sensing can be effectively improved.

Optionally, in the bending state of the display panel shown in FIG. 2, the first strain sensor 11 and the fourth strain sensor 14 are bent inwardly, and resistance values are decreased. The second strain sensor 12 and the third strain sensor 13 are bent outwardly, and resistance values are increased. Because resistance values of the four strain sensors are the same, that is, $R_1=R_2=R_3=R_4$, when resistance change values of the four sensors are also the same, it is assumed that all the change values are $\Delta R$, according to the formula of the differential bridge $$U_0 = U\left(\frac{R_1}{R_1 + R_2} - \frac{R_3}{R_3 + R_4}\right),$$

the output voltage is $U_0=U\Delta R/R_1$ (U is a driving voltage). No non-linear error occurs in the differential bridge circuit, and voltage sensitivity is 4 times as high as that when a single strain sensor (only one resistor is the strain sensor, and the other resistors are ordinary resistors) works.

For example, as shown in FIG. 3, the differential bridge connection circuit includes a driving voltage input end U and a signal output end $U_0$. Optionally, the driving voltage input end U may be connected to a corresponding driving circuit unit by a trace. The signal output end $U_0$ may be connected to a corresponding signal collection circuit by a trace.

As shown in FIG. 1 and FIG. 2, in some embodiments, the display panel has a display area AA and a non-display area disposed around the display area AA, the bending area W passes through the display area AA, and overlaps the display area AA and the non-display area. The first strain sensor 11 and the fourth strain sensor 14 are symmetrically arranged on the non-display area at both sides of the display area AA. The second strain sensor 12 and the third strain sensor 13 are symmetrically arranged on the non-display area at both sides of the display area AA.

The sensor is arranged in the non-display area, and does not affect the display area AA, so that integrated arrangement of the sensors inside the display panel can be facilitated.

For example, the sensors located on the same layer (for example, between the first strain sensor 11 and the fourth strain sensor 14, and between the second strain sensor 12 and the third strain sensor 13) can be directly connected by using traces on a same layer. The sensors located on different layers (for example, between the first strain sensor 11 and the second strain sensor 12) are connected by traces on two layers through via holes arranged between the two layers. Optionally, the connecting traces and via holes between the sensors are disposed in the non-display area.

As shown in FIG. 2 and FIG. 4, in some embodiments, the neutral layer 2 is a cathode layer 21, that is, the strain of the cathode layer 21 of the display panel after the bending area W is bent is almost zero. The display panel further includes a substrate 3 and a cover plate 4 separately located on two sides of the cathode layer 21. The first strain sensor 11 and the fourth strain sensor 14 are located between the cathode layer 21 and the substrate 3. The second strain sensor 12 and the third strain sensor 13 are located between the cathode layer 21 and the cover plate 4. That is, the two sensors on the lower layer are integrated between the cathode layer 21 and the substrate 3, and the two sensors on the upper layer are integrated between the cathode layer 21 and the cover plate 4. For example, the cathode layer 21 is a whole metal layer.

Compared with external independent sensor elements, the integrated sensor integrated in the display panel has advantages of small size, low cost, reduced motherboard space, and fewer system resources.

As shown in FIG. 4, in some embodiments, the display panel further includes a first source-drain electrode layer 5 located between the substrate 3 and the cathode layer 21, and a second source-drain electrode layer 6 located between the cathode layer 21 and the cover plate 4. Optionally, the first strain sensor 11, the fourth strain sensor 14, and the first source-drain electrode layer 5 are made of the same material, and are prepared in the same layer. The second strain sensor 12, the third strain sensor 13, and the second source-drain electrode layer 6 are made of the same material, and are prepared in the same layer. In this way, it can be ensured that materials of the four sensors are the same, and there is no need to add an additional layer structure to the display panel and a patterning process to prepare the sensors.

Optionally, the display panel includes structures, such as, a first Thin Film Transistor (TFT) array, an anode, an organic electroluminescence layer (not shown in the figure) disposed between the substrate 3 and the cathode layer 21. The TFT array is configured to drive the anode. The first source-drain electrode layer 5 is a source-drain electrode layer of the first TFT array.

Optionally, the display panel includes structures, such as, a second TFT array and a touch electrode (not shown in the figure) disposed between the cathode layer 21 and the cover plate 4. The second TFT array is configured to drive the touch electrode. The second source-drain electrode layer 6 is a source-drain electrode layer of the second TFT array.

In some embodiments, the first strain sensor 11, the second strain sensor 12, the third strain sensor 13, and the fourth strain sensor 14 are made of titanium (Ti), aluminum (Al), or a titanium composite material.

Conventional strain sensors generally use materials such as constantan, and therefore cannot be applied in screen integration and are seriously affected by temperature. The strain sensors in the embodiment of the present disclosure are integrated inside the display panel and are prepared on the same layer as the source-drain electrodes. The strain sensors are made of the titanium/aluminum/titanium (Ti/Al/Ti) composite materials with small size, low cost, and little temperature impact, and high resolution.

FIG. 5 is a data distribution diagram of a test result of a bending sensing experiment of strain sensors in a display panel according to an embodiment of the present disclosure. The strain sensor is a resistance strain gauge prepared in the same layer as the source-drain electrode layer, and is specifically made of a titanium/aluminum/titanium (Ti/Al/Ti) composite material. FIG. 5 includes date change curves of resolution of a strain sensor changing with a bending angle in two cases in which the display panel is bent inwardly and outwardly, respectively, in the first quadrant and the third quadrant. A horizontal coordinate represents the bending angle, and a vertical coordinate represents the resolution $\gamma = \Delta R/R_0$. Specifically, $R_0$ is resistance of the strain sensor on which no stress is put, and $\Delta R$ is a resistance change value of the strain sensor on which stress is put. It can be learned from FIG. 5 that, for the strain sensor provided by the embodiment of the present disclosure, the resolution has better linearity and lower noise in two cases of bending inwardly and outwardly. Further, an output voltage $U_0 = U\Delta R/R_1$ ($R_1 = R_0$) of the sensing component provided by the embodiment of the present disclosure also has better linearity and lower noise. Therefore, the sensing sensitivity of the display panel can be effectively improved.

As shown in FIG. 1, in some embodiments, the first source-drain electrode layer 5 may include a first source-drain electrode located in a display area AA and a driving line 51 (VS S) disposed around the display area AA. The display panel further includes a crack dam 7 disposed around the driving line 51. For example, the first strain sensor 11 and the fourth strain sensor 14 may be located between the driving line 51 and the crack dam 7.

As shown in FIG. 2 and FIG. 4, in some embodiments, the first strain sensor 11 and the second strain sensor 12 constitute adjacent bridge arms, and a projection of the first strain sensor 11 on the neutral layer 2 overlaps with a projection of the second strain sensor 12 on the neutral layer 2 to form a back-to-back structure. The fourth strain sensor 14 and the third strain sensor 13 constitute adjacent bridge arms, and a projection of the fourth strain sensor 14 on the neutral layer 2 overlaps with a projection of the three strain sensors 13 on the neutral layer 2 to form a back-to-back structure. Positions of the projections of the sensors on the upper and lower layers are correspondingly coincident, so that the sensors on the upper and lower layers can have approximately the same strain magnitude and approximately the same resistance change value. In this way, linearity and anti-noise performance of the output voltage can be improved, and sensitivity and resolution of bending sensing can be improved.

Optionally, the display panel provided by the embodiment of the present disclosure may be a flexible AMOLED display panel.

An embodiment of the present disclosure further provides a display device, including the display panel according to any of the above contents.

A specific type of the display device provided by the embodiment of the present disclosure is not limited. For example, the display device may be a foldable mobile phone, a notebook computer, an e-book, a tablet computer, or the like.

Based on the display panel provided by the embodiment of the present disclosure, an embodiment of the present disclosure further provides a preparing method of the display panel. As shown in FIG. 6, the method includes the following steps:

Step 101: preparing a source-drain electrode material layer on the substrate, and forming patterns of the first source-drain electrode layer, the first strain sensor, and the fourth strain sensor by using a patterning process.

Step 102: manufacturing a cathode layer on the first source-drain electrode layer.

Step 103: preparing a source-drain electrode material layer on the cathode layer, and forming patterns of the second source-drain electrode layer, the second strain sensor, and the third strain sensor by using a patterning process.

For example, the display panel further includes a step such as preparing other layer structures (structure layers other than the source-drain electrode layer) of a first TFT array, an anode layer, an organic electroluminescent layer, a thin film encapsulation (TFE) layer, and a photo spacer (PS), other layer structures of a second TFT array (structural layers other than the source-drain electrode layer), and a touch electrode layer.

The preparing method of the display device provided by the embodiment of the present disclosure may adopt the same specific implementations as the display panel of the embodiment of the present disclosure, and has the same beneficial effects as the display panel of the embodiment of the present disclosure. Details are not described herein.

Obviously, those skilled in the art can make various modifications and variations to the embodiments of the present disclosure without departing from the spirit and scope of the present disclosure. In this way, if these modifications and variations of the present disclosure fall within the scope of the claims of the present disclosure and their equivalent technologies, the present disclosure also intends to include these modifications and variations.

What is claimed is:

1. A display panel having a bending area and comprising a sensing component configured to sense a bending state of the bending area;
wherein the sensing component comprises
a differential bridge connection circuit composed of a first strain sensor, a second strain sensor, a third strain sensor, and a fourth strain sensor; and
wherein:
the first strain sensor, the second strain sensor, the third strain sensor, and the fourth strain sensor are resistance transducers, and are located in the bending area;
the first strain sensor and the fourth strain sensor constitute first opposite bridge arms;
the second strain sensor and the third strain sensor constitute second opposite bridge arms; and
the first opposite bridge arms and the second opposite bridge arms are separately located on two sides of a neutral layer of the display panel
wherein the display panel further has a display area and a non-display area disposed around the display area;
wherein:
the first strain sensor and the fourth strain sensor are symmetrically disposed on the non-display area at both sides of the display area; and
the second strain sensor and the third strain sensor are symmetrically disposed on the non-display area at both sides of the display area;
wherein the neutral layer is a cathode layer; and the display panel further comprises a substrate and a cover plate separately located on two sides of the cathode layer; wherein:
the first strain sensor and the fourth strain sensor are located between the cathode layer and the substrate; and
the second strain sensor and the third strain sensor are located between the cathode layer and the cover plate.

2. A display device, comprising the display panel according to claim 1, wherein the display panel has a bending area, and comprises a sensing component configured to sense a bending state of the bending area; and
wherein the sensing component comprises
a differential bridge connection circuit composed of a first strain sensor, a second strain sensor, a third strain sensor, and a fourth strain sensor; and
wherein:
the first strain sensor, the second strain sensor, the third strain sensor, and the fourth strain sensor are resistance transducers, and are located in the bending area;
the first strain sensor and the fourth strain sensor constitute first opposite bridge arms;
the second strain sensor and the third strain sensor constitute second opposite bridge arms, and
the first opposite bridge arms and the second opposite bridge arms are separately located on two sides of a neutral layer of the display panel;
wherein the display panel further has a display area and a non-display area disposed around the display area;
wherein:
the first strain sensor and the fourth strain sensor are symmetrically disposed on the non-display area at both sides of the display area; and
the second strain sensor and the third strain sensor are symmetrically disposed on the non-display area at both sides of the display area;
wherein the neutral layer is a cathode layer; and the display panel further comprises a substrate and a cover plate separately located on two sides of the cathode layer; wherein:
the first strain sensor and the fourth strain sensor are located between the cathode layer and the substrate; and
the second strain sensor and the third strain sensor are located between the cathode layer and the cover plate.

3. The display device of claim 2, further comprises:
a first source-drain electrode layer located between the substrate and the cathode layer, and
a second source-drain electrode layer located between the cathode layer and the cover plate; wherein:
the first strain sensor, the fourth strain sensor, and the first source-drain electrode layer are made of same material, and are prepared in same layer; and
the second strain sensor, the third strain sensor, and the second source-drain electrode layer are made of same material, and are prepared in same layer.

4. The display device of claim 3, wherein the first source-drain electrode layer comprises a first source-drain electrode located in the display area and a drive line disposed around the display area;
the display panel further comprises a crack dam disposed around the drive line; and the first strain sensor and the fourth strain sensor are located between the drive line and the crack dam.

5. The display device of claim 4, wherein,
the first strain sensor and the second strain sensor constitute adjacent bridge arms, and a projection of the first strain sensor on the neutral layer overlaps with a projection of the second strain sensor on the neutral layer; and
the third strain sensor and the fourth strain sensor constitute adjacent bridge arms, and a projection of the third strain sensor on the neutral layer overlaps with a projection of the fourth strain sensor on the neutral layer.

6. The display device of claim 2, wherein the first strain sensor and the fourth strain sensor are disposed on a same layer, the second strain sensor and the third strain sensor are disposed on a same layer, and
the first strain sensor, the second strain sensor, the third strain sensor, and the fourth strain sensor are same in material, shape, and size.

7. The display device of claim 3, wherein the first strain sensor, the second strain sensor, the third strain sensor, and the fourth strain sensor are made of titanium, aluminum, or a titanium composite material.

8. The display panel of claim 1, further comprising:
a first source-drain electrode layer located between the substrate and the cathode layer, and
a second source-drain electrode layer located between the cathode layer and the cover plate;
wherein:
the first strain sensor, the fourth strain sensor, and the first source-drain electrode layer are made of same material, and are prepared in same layer; and
the second strain sensor, the third strain sensor, and the second source-drain electrode layer are made of same material, and are prepared in same layer.

9. The display panel of claim 8, wherein the first strain sensor, the second strain sensor, the third strain sensor, and the fourth strain sensor are made of titanium, aluminum, or a titanium composite material.

10. The display panel of claim 8, wherein the first source-drain electrode layer comprises a first source-drain electrode located in the display area and a drive line disposed around the display area;
the display panel further comprises a crack dam disposed around the drive line; and
the first strain sensor and the fourth strain sensor are located between the drive line and the crack dam.

11. The display panel of claim 10, wherein,
the first strain sensor and the second strain sensor constitute adjacent bridge arms, and a projection of the first strain sensor on the neutral layer overlaps with a projection of the second strain sensor on the neutral layer; and
the third strain sensor and the fourth strain sensor constitute adjacent bridge arms, and a projection of the third strain sensor on the neutral layer overlaps with a projection of the fourth strain sensor on the neutral layer.

12. The display panel of claim 1, wherein the first strain sensor and the fourth strain sensor are disposed on a same layer, the second strain sensor and the third strain sensor are disposed on a same layer, and
the first strain sensor, the second strain sensor, the third strain sensor, and the fourth strain sensor are same in material, shape, and size.

13. A preparing method of the display panel of claim 1, further comprising:
preparing a source-drain electrode material layer on the substrate, and forming patterns of the first source-drain electrode layer, the first strain sensor, and the fourth strain sensor by using a patterning process;
manufacturing a cathode layer on the first source-drain electrode layer; and
preparing a source-drain electrode material layer on the cathode layer, and forming patterns of the second source-drain electrode layer, the second strain sensor, and the third strain sensor by using a patterning process.

* * * * *